(12) United States Patent
Lee et al.

(10) Patent No.: US 10,276,591 B2
(45) Date of Patent: Apr. 30, 2019

(54) VERTICAL MEMORY DEVICE

(71) Applicant: SAMSUNG ELECTRONICS CO., LTD., Suwon-si, Gyeonggi-do (KR)

(72) Inventors: Kwang Ho Lee, Seoul (KR); Kwang Ho Kim, Suwon-si (KR); Seung Hynu Cho, Suwon-si (KR); Ji Hwan Yu, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/937,932

(22) Filed: Mar. 28, 2018

(65) Prior Publication Data

US 2019/0027491 A1    Jan. 24, 2019

(30) Foreign Application Priority Data

Jul. 21, 2017    (KR) .................. 10-2017-0092477

(51) Int. Cl.
| | |
|---|---|
| *H01L 29/792* | (2006.01) |
| *H01L 27/11582* | (2017.01) |
| *H01L 27/11568* | (2017.01) |
| *H01L 23/528* | (2006.01) |
| *H01L 27/11565* | (2017.01) |
| *H01L 27/11573* | (2017.01) |
| *H01L 29/423* | (2006.01) |
| *H01L 29/788* | (2006.01) |
| *H01L 29/10* | (2006.01) |

(52) U.S. Cl.
CPC ...... *H01L 27/11582* (2013.01); *H01L 23/528* (2013.01); *H01L 27/11565* (2013.01); *H01L 27/11568* (2013.01); *H01L 27/11573* (2013.01); *H01L 29/4234* (2013.01); *H01L 29/1037* (2013.01); *H01L 29/7889* (2013.01)

(58) Field of Classification Search
USPC ...... 257/314–326, E27.078, E29.3–E29.309, 257/255–266, E21.179–E21.182, 257/E21.209–E21.21, E21.422, E21.423, 257/E21.679–E21.694
See application file for complete search history.

(56) References Cited

U.S. PATENT DOCUMENTS

| | | | |
|---|---|---|---|
| 8,476,713 B2 | 7/2013 | Lee et al. | |
| 9,478,561 B2 * | 10/2016 | Kim | ............ H01L 27/11575 |
| 9,595,533 B2 | 3/2017 | Tanzawa et al. | |
| 9,741,733 B2 * | 8/2017 | Lim | ............ H01L 27/11582 |

(Continued)

*Primary Examiner* — Niki H Nguyen
(74) *Attorney, Agent, or Firm* — F. Chau & Associates, LLC

(57) ABSTRACT

A vertical memory device includes a substrate having a cell array region and a connection region adjacent to the cell array region, a plurality of gate electrode layers stacked on the cell array region and the connection region of the substrate, and forming a stepped structure in the connection region, a first metal line dividing the plurality of gate electrode layers and connected to the cell array region and the connection region of the substrate, and a second metal line dividing a portion of the plurality of gate electrode layers and connected to the connection region of the substrate. A depth of a lower end portion of the second metal line may be greater than a depth of a lower end portion of the first metal line in the cell array region, based on an upper surface of the substrate.

20 Claims, 14 Drawing Sheets

III-III'

(56) References Cited

U.S. PATENT DOCUMENTS

2014/0141610 A1    5/2014   Jin et al.
2016/0268287 A1    9/2016   Park et al.
2016/0293622 A1   10/2016   Jeong et al.
2017/0040337 A1    2/2017   Kim et al.

* cited by examiner

III-III'

IV-IV'

VERTICAL MEMORY DEVICE

CROSS-REFERENCE TO RELATED APPLICATION(S)

This application claims priority from Korean Patent Application No. 10-2017-0092477 filed on Jul. 21, 2017 in the Korean Intellectual Property Office, the disclosure of which is incorporated by reference herein.

1. Technical Field

The present inventive concept relates to a vertical memory device.

2. Discussion of the Related Art

Volumes of electronic products have gradually been reduced, while at the time such electronic products are still used to process high capacity data in ever-increasing amounts. Thus, the degree of integration of semiconductor memory devices used in such electronic products needs to be increased. Accordingly, in a method in which the degree of integration of semiconductor memory devices may be increased, a vertical memory device, in which a plurality of memory cells having a vertical transistor structure are stacked (as opposed to an existing planar transistor structure), has been proposed.

SUMMARY

An example embodiment of the present inventive concept provides a vertical memory device in which a process defect may be reduced. Such reduction may occur in a case where a common source line and a dummy source line are not in contact with a substrate.

According to an example embodiment of the present inventive concept, a vertical memory device may include a substrate having a cell array region and a connection region adjacent to the cell array region, a plurality of gate electrode layers stacked on the cell array region and the connection region of the substrate, and a stepped structure formed in the connection region, at least one first metal line dividing the plurality of gate electrode layers and connected to the cell array region and the connection region of the substrate, and at least one second metal line dividing a portion of the plurality of gate electrode layers and connected to the connection region of the substrate. In an embodiment of the inventive concept, a depth of a lower end portion of the second metal line may be greater than a depth of a lower end portion of the first metal line in the cell array region, based on an upper surface of the substrate. In addition, when there are a plurality of first metal lines and second metal lines, a depth of the lower end portion of each of the second metal lines may be increased relative to a respective position toward an edge of the connection region. Moreover, the depth of the lower end portion of each of the first metal lines is increased relative to a respective position toward an edge of the connection region.

According to an example embodiment of the present inventive concept, a vertical memory device may include a substrate having a cell array region and a connection region located outside the cell array region, first and second recesses formed in an upper portion of the substrate, the first recess extending in a first direction in the cell array region and the connection region and the second recess being disposed in the connection region, a common source line disposed on the first recess, and a dummy source line disposed on the second recess. In this case, a depth of the second recess is greater than a depth of the first recess of the cell array region, based on an upper surface of the substrate.

According to an example embodiment of the present inventive concept, a vertical memory device may include a substrate having a cell array region and a connection region adjacent to the cell array region, a stacked structure including a plurality of gate electrode layers stacked on the cell array region and the connection region of the substrate, and extending to have different lengths in the connection region, a common source line dividing the stacked structure in the cell array region and the connection region, and a dummy source line dividing the stacked structure in the connection region. In this case, a vertical length of the dummy source line is greater them a vertical length of the common source line.

In an embodiment of the inventive concept, a method of manufacturing a vertical memory semiconductor device may include providing a substrate having a a cell array region and a connection region adjacent to the cell array region; forming a stacked structure comprising a plurality of gate electrode layers stacked on the cell array region and the connection region of the substrate, wherein the plurality of gate electrode layers form a stepped structure in the connection region; dividing the stacked structure by arranging at least one common source line in the cell array region and the connection region; and arranging at least one dummy source line to further divide the stacked structure in the connection region, wherein a depth of a lower end portion of the at least one dummy line is greater than a depth of a lower end portion of the at least one common source line in the cell array region, based on an upper surface of the substrate.

The method of manufacturing a vertical memory semiconductor device may further include that a difference between a depth of a lower end portion of the at least one dummy source line, and a depth of a lower end portion of the at least one source line in the cell array region is about 15 nm or more.

The method of manufacturing a vertical memory semiconductor device may further include that a height from an upper surface of the substrate to an upper surface of an uppermost gate electrode layer among the plurality of gate electrode layers is about 4.4 μm or more.

BRIEF DESCRIPTION OF DRAWINGS

The above and other aspects, features, and benefits of the present disclosure will be better-appreciated by a person of ordinary skill in the art from the following detailed description when taken in conjunction with the accompanying drawings, in which:

FIG. 4 is a cross-sectional view of a vertical memory device according to the present inventive concept taken along line II-II' of FIG. 2;

DETAILED DESCRIPTION

Hereinafter, example embodiments of the present inventive concept will be described with reference to the accompanying drawings. A person of ordinary skill in the art should understand and appreciate that the example embodiments of the inventive concept are provided for illustrative purposes, and the appended claims are not limited to such embodiments.

It will be understood that when an element or layer is referred to as being "on", "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will also be understood by a person of ordinary skill in the art that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Figure 1:
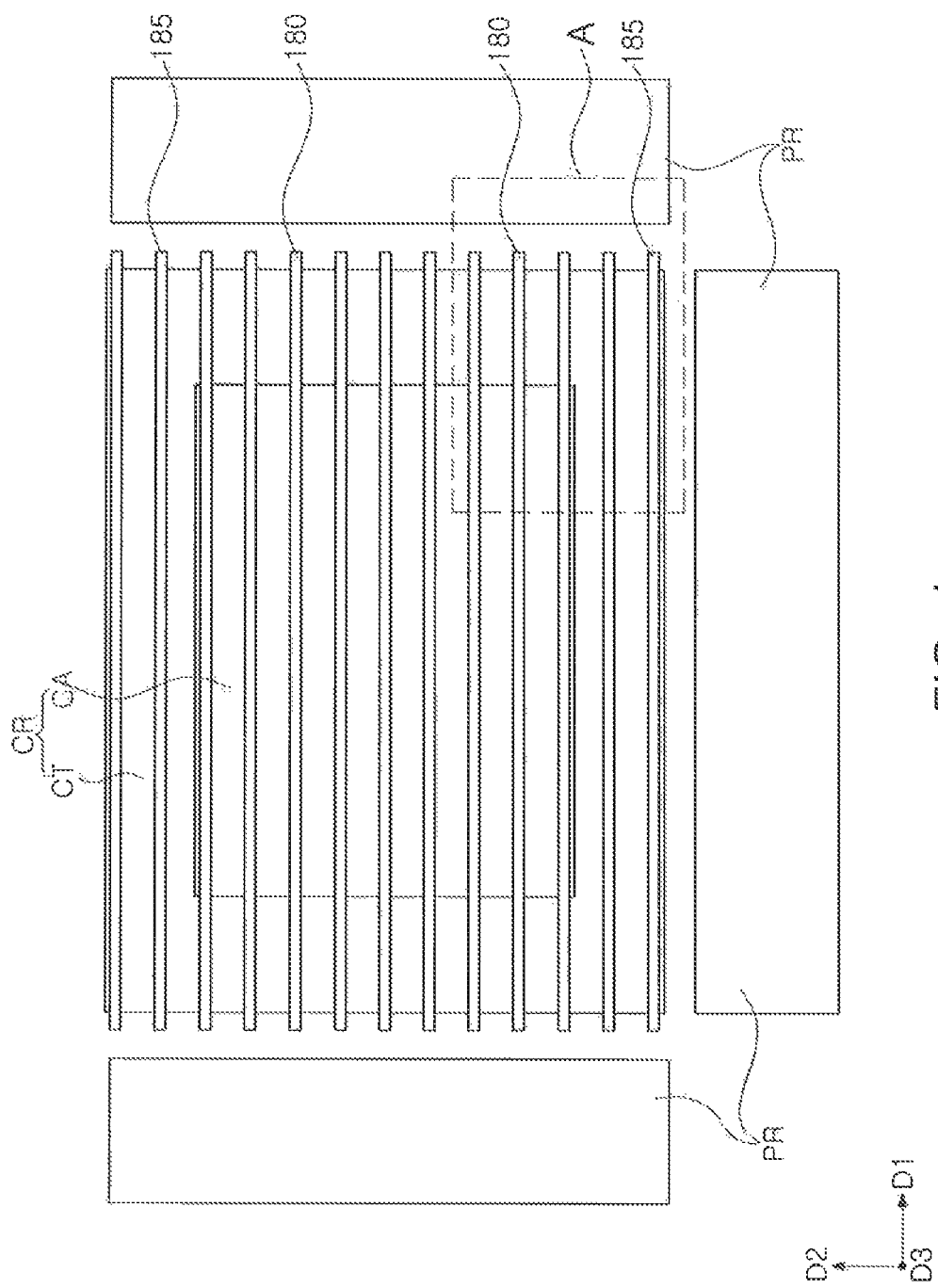
FIG. 1 is a schematic layout diagram of a vertical memory device according to an example embodiment of the present inventive concept.

FIG. 1 is a schematic diagram of a vertical memory device according to an example embodiment of the inventive concept.

Referring to FIG. 1, a vertical memory device according to an example embodiment may include a cell region CR in which a plurality of memory cells are formed, and one or more peripheral circuit regions PR in which peripheral circuits driving the memory cells are formed. For example, a row decoder circuit, a column decoder circuit, a page buffer circuit and the like may be disposed in the peripheral circuit regions PR. FIG. 1 is illustrated by way of example, and the arrangement of the peripheral circuit regions PR is not limited to that shown in the drawing. A plurality of common source lines 180 extending in a first direction D1 may be disposed in the cell region CR. The plurality of common source lines 180 may also be referred to as first metal lines. The plurality of common source lines 180 may be arranged to have a desired interval there between in a second direction D2 intersecting the first direction D1. The cell region CR may be divided into a plurality of regions by the common source lines 180. The cell region CR may include a cell array region CA and a connection region CT surrounding the cell array region CA. The plurality of common source lines 180 may extend in the first direction D1 to be integrally formed in the cell array region CA and the connection region CT. A plurality of dummy source lines 185 extending in the first direction D1 may be disposed in the connection region CT. The plurality of dummy source lines 185 may be referred to as second metal lines. In an embodiment of the inventive concept, the vertical memory device may have a quantity of common source lines that is greater than a quantity of dummy lines.

The number of common source lines 180 and the number of dummy source lines 185 illustrated in FIG. 1 are provided for illustrative purposes, and are not limited thereto.

Figure 2:
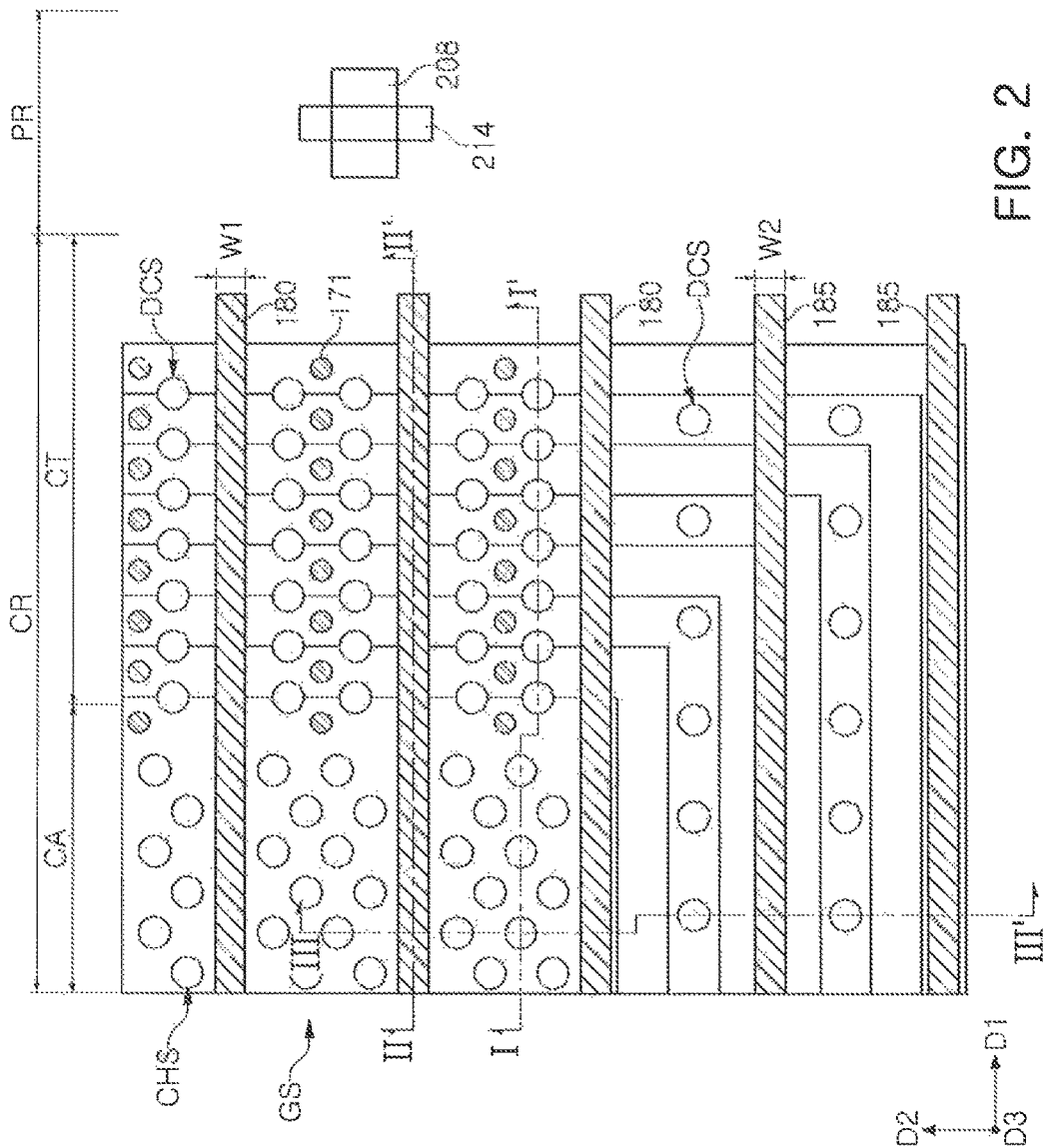
FIG. 2 is a schematic plan view of a vertical memory device according to an example embodiment of the present inventive concept.

FIG. 2 is a schematic plan view of a vertical memory device according to an example embodiment of the inventive concept. In FIG. 2, region A of FIG. 1 is enlarged and illustrated.

Referring to FIG. 2, a vertical memory device according to an example embodiment may include a substrate having a cell array region CA in which memory cells are formed, a connection region CT that connects gate electrodes of the memory cells to wirings, and a peripheral circuit region PR in which peripheral circuits controlling the memory cells are formed. The cell array region CA and the connection region CT may collectively constitute a cell region CR.

A stacked structure GS extending in the first direction D1 may be disposed in the cell array region CA and the connection region CT. The stacked structure GS may include a plurality of gate electrode layers and a plurality of mold insulating layers alternately stacked on the substrate. The stacked structure GS may be divided into a plurality of regions by a plurality of common source lines 180 and a plurality of dummy source lines 185. The plurality of common source lines 180 may extend continuously in the first direction D1 in the cell array region CA and the connection region CT. The plurality of dummy source lines 185 may extend continuously in the connection region CT in the first direction D1. The plurality of common source lines 180 and the plurality of dummy source lines 185 may be electrically connected to the substrate. The common source lines 180 may have a first line width W1, and the dummy source lines 185 may have a second line width W2. The first line width W1 and the second line width W2 may be equal to each other. According to an example embodiment, the second line width W2 may be greater than the first line width W1.

An interval between the common source lines 180 may be equal to an interval between the dummy source lines 185. According to an example embodiment, the interval between the common source lines 180 may be different from that between the dummy source lines 185. For example, the interval between the common source lines 180 may be narrower than the interval between the dummy source lines 185.

A plurality of channel structures CHS may be disposed in the cell array region CA, in such a manner that the channel structures CHS penetrate through the stacked structure GS to be connected to the substrate. A plurality of dummy channel structures DCS and a plurality of contact plugs 171 penetrating through the stacked structure GS may be disposed in the connection region CT, to be connected to the substrate and the plurality of gate electrode layers, respectively.

In the cell array region CA, the plurality of channel structures CHS may be arranged in a plurality of columns. In FIG. 2, the channel structures CHS are illustrated as being arranged in four columns between a pair of common source lines 180 by way of example. The plurality of channel structures CHS may be arranged in a zigzag fashion. The arrangement of the plurality of channel structures CHS is not limited to that shown in FIG. 2, and may be variously modified.

The stacked structure GS may be formed to have a stepped structure including a plurality of stepped layers in the connection region CT. The stepped structure may be formed by extending the plurality of gate electrode layers and a plurality of mold insulating layers of the stacked structure GS to different lengths. The plurality of dummy channel structures DCS may be disposed to be adjacent to ends of the plurality of stepped layers to assist with stability of the vertical memory device. Although the plurality of dummy channel structures DCS are illustrated as being arranged in two columns between a pair of common source lines 180 in FIG. 2, the arrangement of dummy channel structures DCS is not limited thereto. For example, a portion of the dummy channel structures DCS may be disposed adjacent to ends of the plurality of stepped layers, and remaining dummy channel structures may be disposed to be spaced apart from ends of the plurality of stepped layers. A plurality of dummy channel structures DCS may also be further disposed in a vicinity of the dummy source lines 185.

Although the plurality of channel structures CHS are connected to bit lines for reading/writing operations, the plurality of dummy channel structures DCS may not be connected to the bit lines. Thus, the plurality of dummy channel structures DCS may not provide memory cells, but may serve to support the stacked structure GS in the connection region CT.

In addition, while FIG. 2 shows only one circuit transistor for clarity, the peripheral circuit region PR may include a plurality of circuit transistors. The circuit transistor may include a gate electrode 214 and a source/drain region 208 disposed on both sides of the gate electrode 214.

Figure 3:
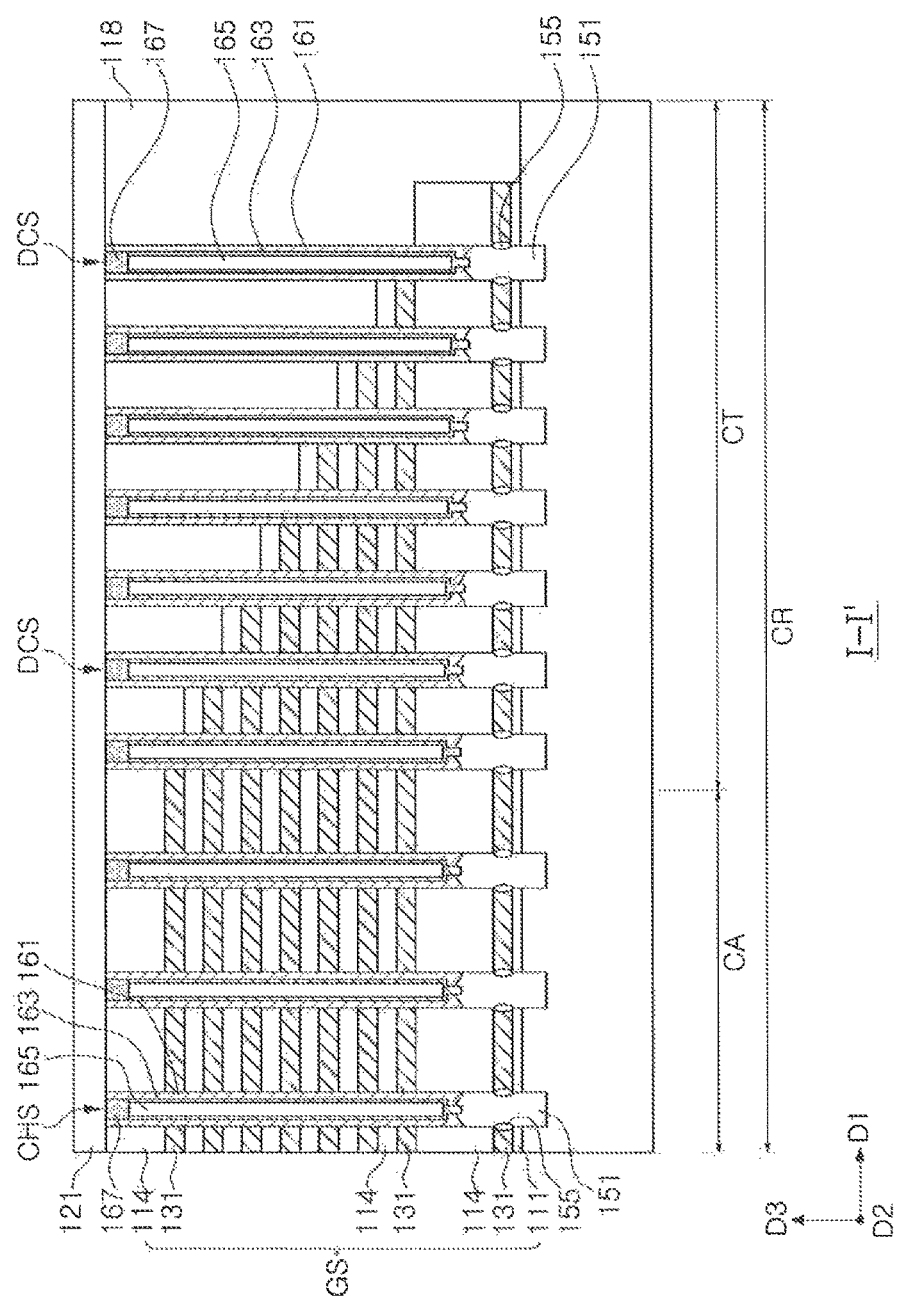
FIG. 3 is a cross-sectional view of a vertical memory device according to the present inventive concept taken along line I-I' of FIG. 2.
Figure 4:
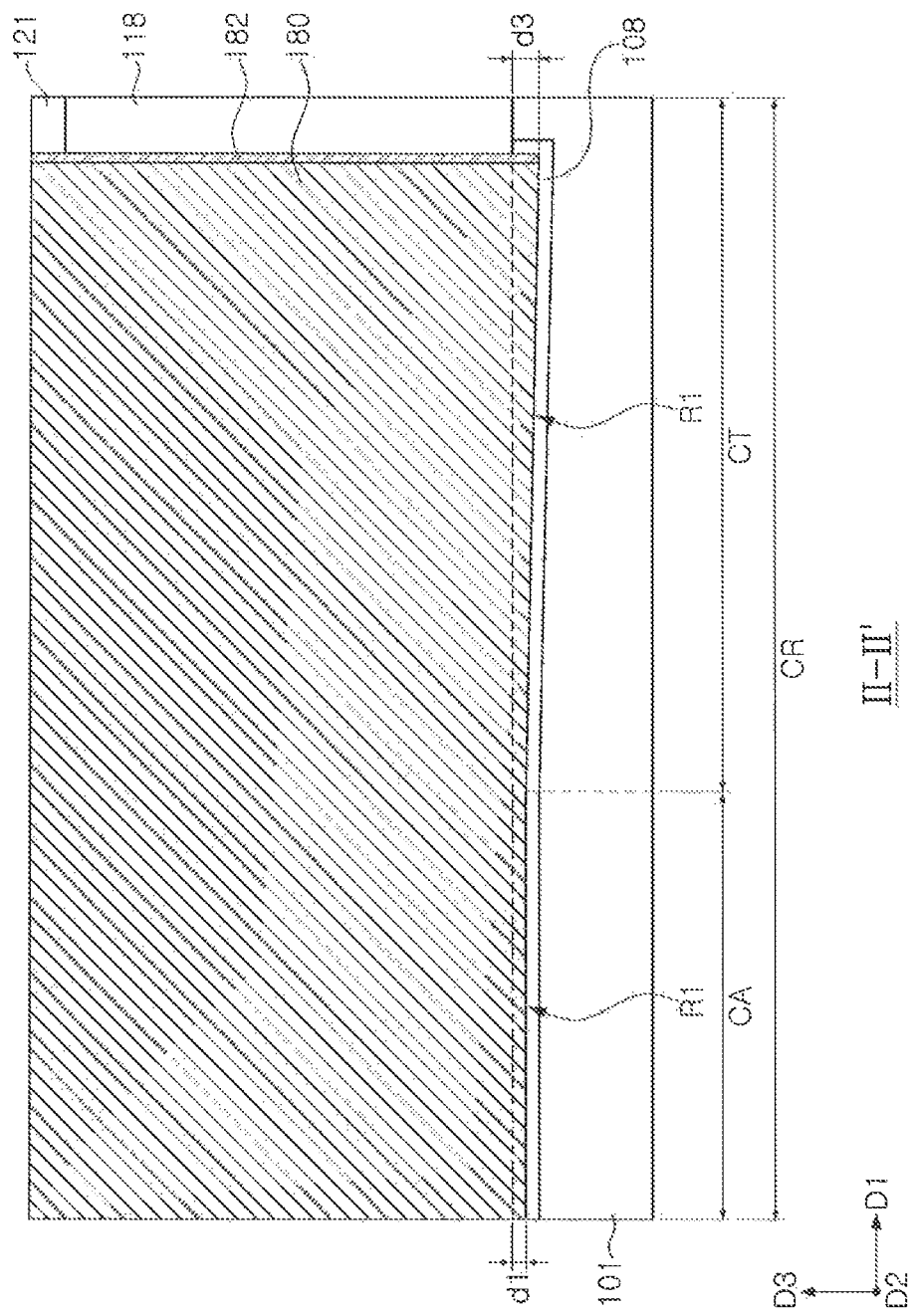
FIG. 4 is
Figure 5:
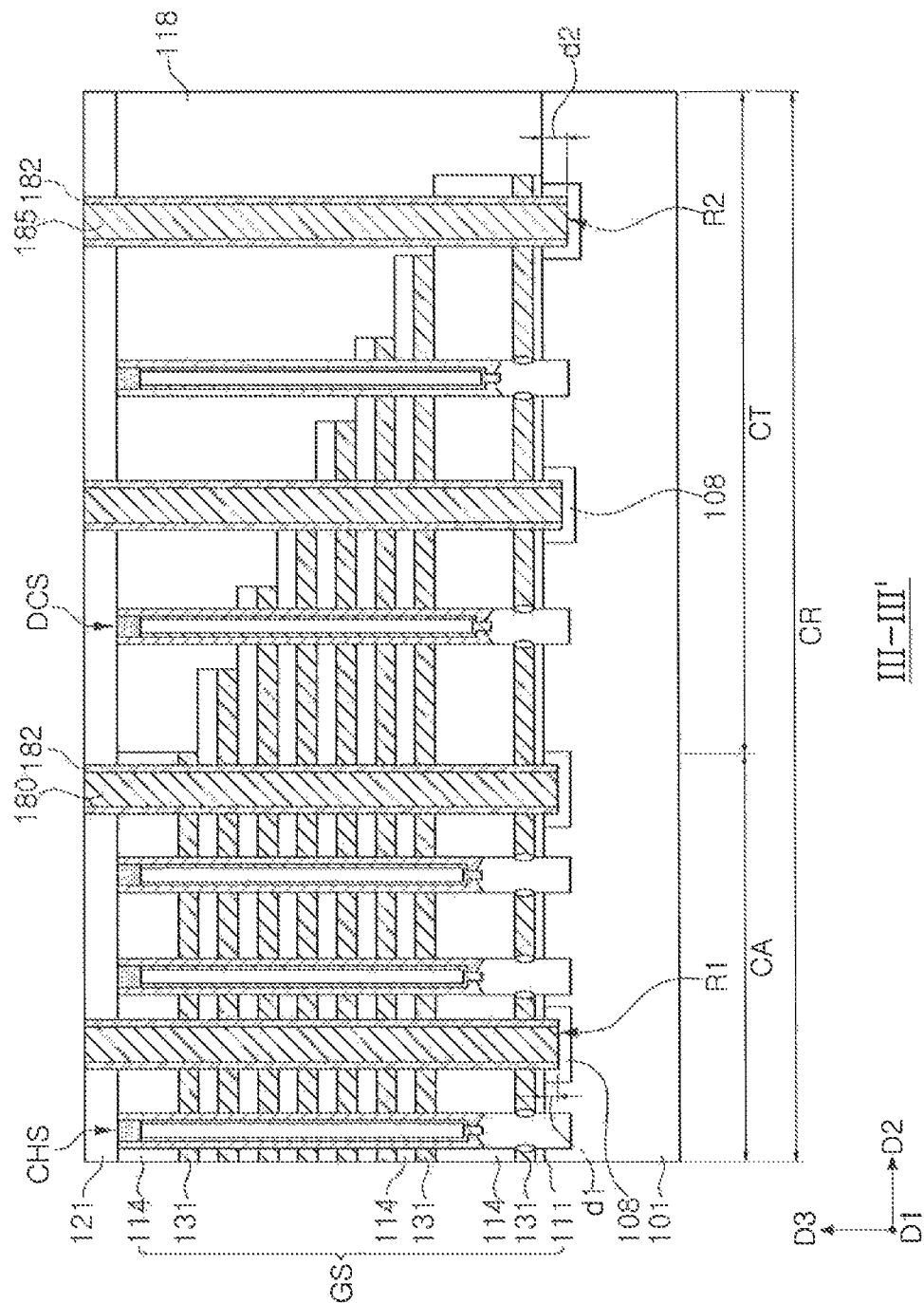
FIG. 5 is a cross-sectional view of a vertical memory device according to the present inventive concept taken along line III-III' of FIG. 2.

FIGS. 3 to 5 are schematic cross-sectional views of a vertical memory device according to an example embodiment of the inventive concept. FIG. 3 is a cross-sectional view taken along line I-I' of FIG. 2, FIG. 4 is a cross-sectional view taken along line II-II' of FIG. 2, and FIG. 5 is a cross-sectional view taken along line III-III' of FIG. 2.

With reference to FIGS. 3 to 5, the vertical memory device may include, for example, a substrate 101, a stacked structure GS, a plurality of common source lines 180, a plurality of dummy source lines 185, channel structures CHS, dummy channel structures DCS, and the like.

The substrate 101 may be comprised of a semiconductor material, such as a group IV semiconductor material, a group III-V compound semiconductor material, or a group II-VI compound semiconductor material. As shown in FIG. 3, the stacked structure GS may include a plurality of gate electrode layers 131 and a plurality of mold insulating layers 114 that are alternately stacked on the substrate 101. The plurality of gate electrode layers 131 may be stacked in a manner so as to be spaced apart from each other on the substrate 101 in a third direction D3 substantially perpendicular to an upper surface of the substrate 101. The plurality of gate electrode layers 131 may extend in a first direction D1 and may be disposed in a cell array region CA and a connection region CT. The stacked structure GS may have a stepped structure in which a plurality of stepped layers are formed in the connection region CT. The plurality of gate electrode layers 131 may extend in a manner to have different lengths in the first direction D1. The gate electrode layers 131 may be stacked such that each ascending layer extends in a consecutively shorter distance in the second direction D2 so as to form the stepped structure in the connection region CT. The mold insulating layers 114 may also have a stepped structure together with the gate electrode layers 131. A person of ordinary skill in the art should understand and appreciate that while FIG. 3, for example, show each gate electrode layer being successively shorter than a lower layer, but it is within the inventive concept that there could be some electrode layers having the same length, e.g., pairs of layers having extending a same length in the second direction D2, etc.

A buffer insulating layer 111 may be disposed between a lowermost gate electrode layer 131 and the substrate 101. The buffer insulating layer 111, the gate electrode layers 131, and the mold insulating layers 114 may constitute a stacked structure GS. While FIG. 3, for example, shows one buffer insulating layer because it is arranged to provide a buffer insulating layer that on one side is arranged on the substrate. Conversely, there are a plurality of mold insulating layers that may be alternately stacked with the plurality of gate electrode layers 131. The gate electrode layers 131 may include a metal, a metal nitride, a metal silicide material, polycrystalline silicon, and combinations thereof. The metal may include, for example, tungsten (W), copper (Cu), or aluminum (Al). The metal silicide may include, for example, a silicide material including at least one metal selected from cobalt (Co), nickel (Ni), hafnium (Hf), platinum (Pt), tungsten (W) and titanium (Ti), and combinations thereof. The metal nitride may include, for example, tungsten nitride (WN), tantalum nitride (TaN), titanium nitride (TiN), or combinations thereof. The buffer insulating layer 111 and the mold insulating layers 114 may include silicon oxide.

The number of the gate electrode layers 131 is not limited to the depictions in FIGS. 3 and 5. As a storage capacity of the vertical memory device increases, the number of gate electrode layers 131 constituting memory cells may be increased. In one example, several tens to hundreds of gate electrode layers 131 may be stacked on the substrate 101. A height from an upper surface of the substrate 101 to an upper surface of an uppermost gate electrode layer 131 among the plurality of gate electrode layers 131 may be, for example, 4.4 µm or more. The number of gate electrode layers 131 is not limited to any particular number or range.

In addition, the height from the upper surface of the substrate to the upper surface of the uppermost gate electrode layer among the plurality of gate electrode layers is not limited to 4.4 µm or more, and, for example, may be about, for example, 4.2 µm or more.

The vertical memory device may include a first interlayer insulating layer 118 covering a stepped structure of the stacked structure GS while being disposed in the connection region CT, the stacked structure GS, and a second interlayer insulating layer 121 that may be disposed on the first interlayer insulating layer 118. The first interlayer insulating layers 118 and the second interlayer insulating layer 121 may include, for example, silicon oxide or a low-k dielectric material.

A plurality of channel structures CHS penetrating through the plurality of gate electrode layers 131 may be disposed in the cell array region CA. A plurality of dummy channel structures DCS penetrating through the plurality of gate electrode layers 131 may be disposed in the connection region CT. As shown in FIG. 5, for example, the dummy channel structures may abut at one end with the second interlayer insulating layer 121, whereas the common source lines 180 may penetrate the second interlayer insulating layer 121.

The plurality of channel structures CHS disposed in the cell array region CA may include an epitaxial layer 151 (identified in FIG. 3), a gate insulating layer 161, a channel layer 163, a filled insulating layer 165, and a contact pad 167. The plurality of dummy channel structures DCS may have the same or a similar structure as that of the plurality of channel structures CHS. The plurality of dummy channel structures DCS may also include an epitaxial layer 151, a gate insulating layer 161, a channel layer 163, a filled insulating layer 165 and a contact pad 167. Heights of the epitaxial layers 151 of the plurality of each of the dummy channel structures DCS may be different from each other. For example, the respective heights of the epitaxial layers 151 of the plurality of dummy channel structures DCS may be reduced toward an edge of the connection region CT. As a result, the vertical lengths of the gate insulating layers 161, the channel layers 163 and the filled insulating layer 165 of the plurality of dummy channel structures DCS may increase toward an edge of the connection region CT.

The epitaxial layer 151 may be in contact with the substrate 101, and a lower end of the channel layer 163 may contact the epitaxial layer 151 to be electrically connected thereto, and an upper end of the channel layer 163 may contact the contact pad 167 (see FIG. 3) to be electrically connected thereto. The epitaxial layer 151 may be formed by a selective epitaxial growth process. The epitaxial layer 151 may include a semiconductor material such as monocrystalline silicon or the like.

The gate insulating layer 161 may be formed to surround an outer side of the channel layer 163. The gate insulating layer 161 may include, for example, a tunneling layer, a charge storage layer, and a blocking layer sequentially disposed from the outer side of the channel layer 163.

The tunneling layer may include, for example, silicon oxide. The charge storage layer may include, for example, silicon nitride. The blocking layer may include silicon oxide ($SiO_2$), silicon nitride ($Si_3N_4$), silicon oxynitride (SiON), or high-k dielectric material. The high-k dielectric material may be one of aluminum oxide ($Ai_2O_3$), tantalum oxide ($Ta_2O3$), titanium oxide ($TiO_2$), yttrium oxide ($Y_2O_3$), zirconium oxide ($ZrO_2$), zirconium silicon oxide (ZrSixOy), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), and praseodymium oxide ($Pr_2O_3$).

The channel layer 163 may have a macaroni (e.g., tubular) shape. An internal space of the channel layer 163 may be filled with the filled insulating layer 165. The channel layer 163 may include a semiconductor material such as polycrystalline silicon, monocrystalline silicon, or the like.

The filled insulating layer 165 may include an insulating material such as silicon oxide or the like. The contact pad 167 may include a semiconductor material such as polycrystalline silicon or the like.

An insulating layer 155 (see FIG. 3) may be locally disposed between the epitaxial layer 151 and a lowermost gate electrode layer 131. The insulating layer 155 may be formed by oxidizing a portion of the epitaxial layer 151.

The common source lines 180 and the dummy source lines 185 may divide the stacked structure GS into a plurality of regions. The plurality of common source lines 180 may be disposed in the cell array region CA and in the connection region CT, and may divide the plurality of gate electrode layers 131 into a plurality of regions. The plurality of dummy source lines 185 may be disposed in the connection region CT, and the placement of the dummy source lines may divide a portion of the plurality of gate electrode layers 131 into a plurality of regions. The plurality of common source lines 180 and the plurality of dummy source lines 185 may extend in a first direction D1. The plurality of common source lines 180 may be connected to the cell array region CA and the connection region CT of the substrate 101. The plurality of dummy source lines 185 may be connected to the connection region CT of the substrate 101.

The plurality of common source lines 180 and the plurality of dummy source lines 185 may extend to an upper portion of the substrate 101 in a third direction D3. In an upper portion of the substrate 101, first recesses R1 may be formed to extend in the first direction D1 while being disposed in the cell array region CA and the connection region CT, and second recesses R2 may be formed to extend in the first direction D1 while being disposed in the connection region CT. The plurality of common source lines 180 may be disposed on the first recesses R1, and the plurality of dummy source lines 185 may be disposed on the second recesses R2. As can be seen in FIG. 5, a depth of the second recesses R2 may be greater than a depth of the first recesses R1 of the cell array region CA, based on an upper surface of the substrate 101. The depth of the first recesses R1 of the cell array region CA may be substantially uniform, while the depths of the second recesses R2 may be different from each other depending on positions thereof in the connection region CT. The depths of the second recesses R2 may increase toward an edge of the connection region CT, while the depths of the second recesses R2 may decrease toward the cell array region CA.

Referring to FIG. 5, for example, in the case of the second recesses R2 disposed at an edge portion of the connection region CT, a depth d2 of each of the second recesses R2 may be, for example, about 15 nm or more greater than a depth d1 of each of the first recesses R1 of the cell array region CA. The depth d1 of each of the first recesses R1 may be, for example, about 40 nm or more, and the depth d2 of each of the second recesses R2 arranged at an edge portion of the connection regions CT may be, for example, about 55 nm or more. By a construction having two recesses with the approximate depths as discussed herein above, there can be a reduction or even an elimination of Not-Open (NOP) failures that occur from etching during construction. A depth of each lower end portion of the plurality of dummy source lines 185 may be greater than a depth of each lower end portion of the plurality of common source lines 180 in the cell array region CA, based on an upper surface of the substrate 101. The depths of lower end portions of the plurality of common source lines 180 may be substantially uniform in the cell array region CA, based on the upper surface of the substrate 101. On the other hand, the depths of the lower end portions of the dummy source lines 185 may be different from each other, depending on positions thereof in the connection region CT, for example, including but not limited to an ascending depths, or descending depths. The depths of the lower end portions of the dummy source lines 185 may be increased toward an edge of the connection region CT. The depths of the lower end portions of the dummy source lines 185 may be decreased toward the cell array region CA.

In the case of the dummy source lines 185 disposed at an edge portion of the connection region CT, a difference between a depth of each lower end portion of the dummy source lines 185, and a depth of each lower end portion of the common source lines 180 in the cell array region CA may be about 15 nm or more. A vertical length of the dummy source lines 185 may be greater than a vertical length of the common source lines 180. The vertical length refers to a length measured in a third direction, for example, the D3 direction, perpendicular to an upper surface of the substrate 101. The vertical lengths of the dummy source lines 185 may be changed depending on locations thereof in the connection region CT. The vertical lengths of the dummy source lines 185 may be increased toward an edge of the connection region CT. In the case where the dummy source lines 185 are disposed at an edge portion of the connection region CT, a difference between a vertical length of each of the dummy source lines 185, and a vertical length of each of the common source lines 180 in the cell array region CA may be, for example, about 15 nm or more. The depths of the first recesses R1 may be substantially uniform in the cell array region CA, and may be increased toward an edge of the connection region CT in the connection region CT. Referring to one first recess R1, a depth d3 of the first recess R1 at an edge portion of the connection region CT may be 15 nm or more greater than the depth of the first recess R1 in the cell array region CA. Depths of lower end portions of the common source lines 180 may be increased toward an edge of the connection region CT. Referring to one common source line 180, a difference between a depth of a lower end portion of the common source line 180 in the cell array region CA and a depth of a lower end portion of the common source line 180 at an edge portion of the connection region CT may be about 15 nm or more. A person of ordinary skill in the art should understand and appreciate that according to the inventive concept, the values of about 15 nm or more, 40 nm or more, could be, for example, a nanometer less than the ranges disclosed.

The plurality of common source lines 180 and the plurality of dummy source lines 185 may be connected to impurity regions 108 formed in an upper portion of the substrate 101. The plurality of common source lines 180 and dummy source lines 185 may be formed of a conductive material. For example, the plurality of common source lines 180 may include, for example, at least one of a metal such as tungsten, copper, titanium, aluminum and the like, a doped semiconductor material, and a conductive material such as a conductive metal nitride film or the like. For example, when the plurality of common source lines 180 are formed of a doped semiconductor material, the plurality of common source lines 180 may include the same-type impurity as that of the impurity region 108 and may have a doping concentration higher than that of the impurity region 108.

An insulating layer 182 may be disposed on sidewalls of the plurality of common source lines 180 and on sidewalls of the plurality of dummy source lines 185. The insulating layer 182 may electrically insulate the plurality of common source lines 180 from the plurality of gate electrode layers 131. The insulating layer 182 may electrically insulate the plurality of dummy source lines 185 from the plurality of gate electrode layers 131. The insulating layer 182 may include silicon oxide (SiO$_2$), silicon nitride (Si$_3$N$_4$), silicon oxynitride (SiON), or combinations thereof.

Figure 6:
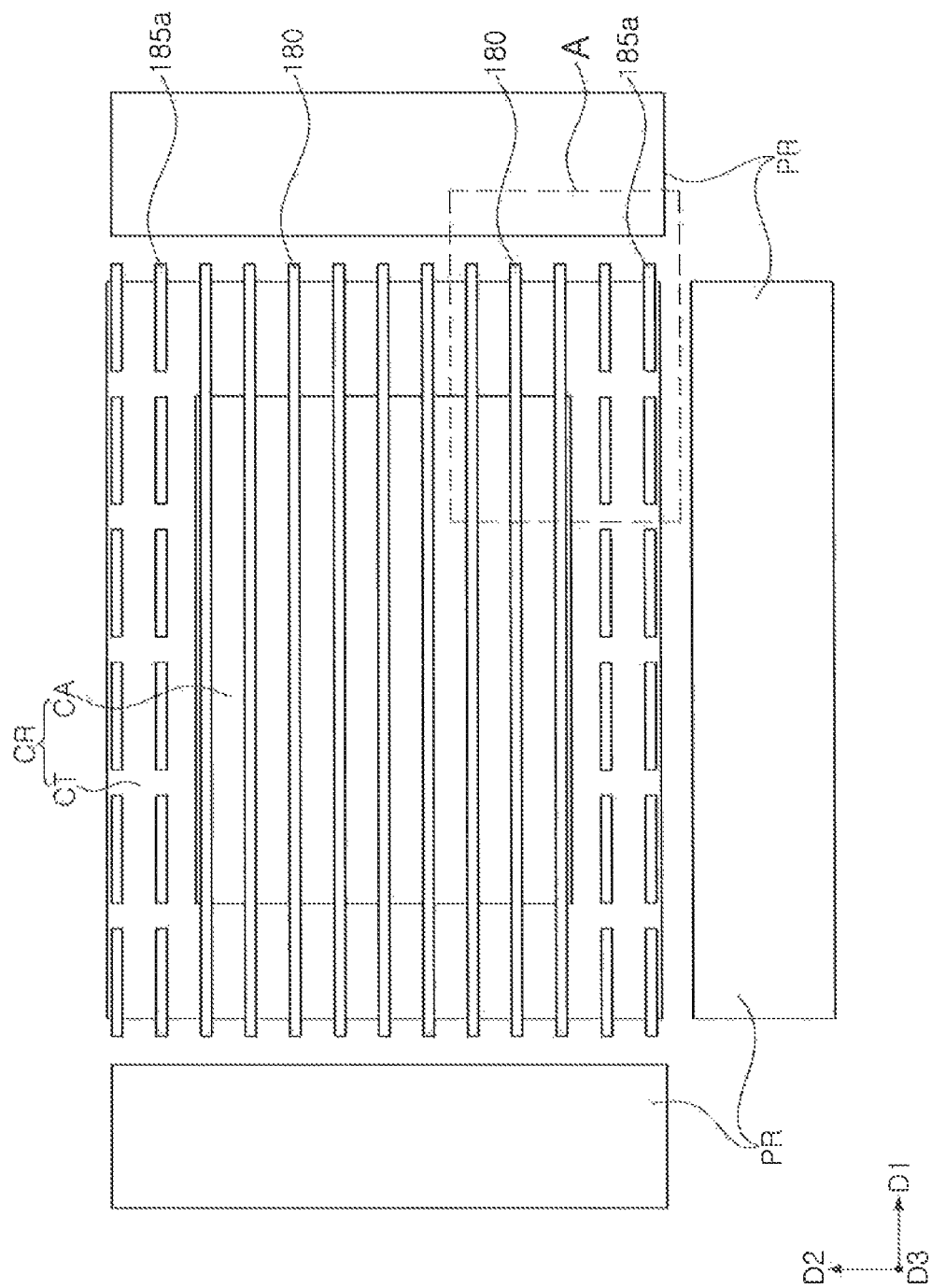
FIG. 6 is a schematic layout diagram of a vertical memory device according to an example embodiment of the present inventive concept.
Figure 7:
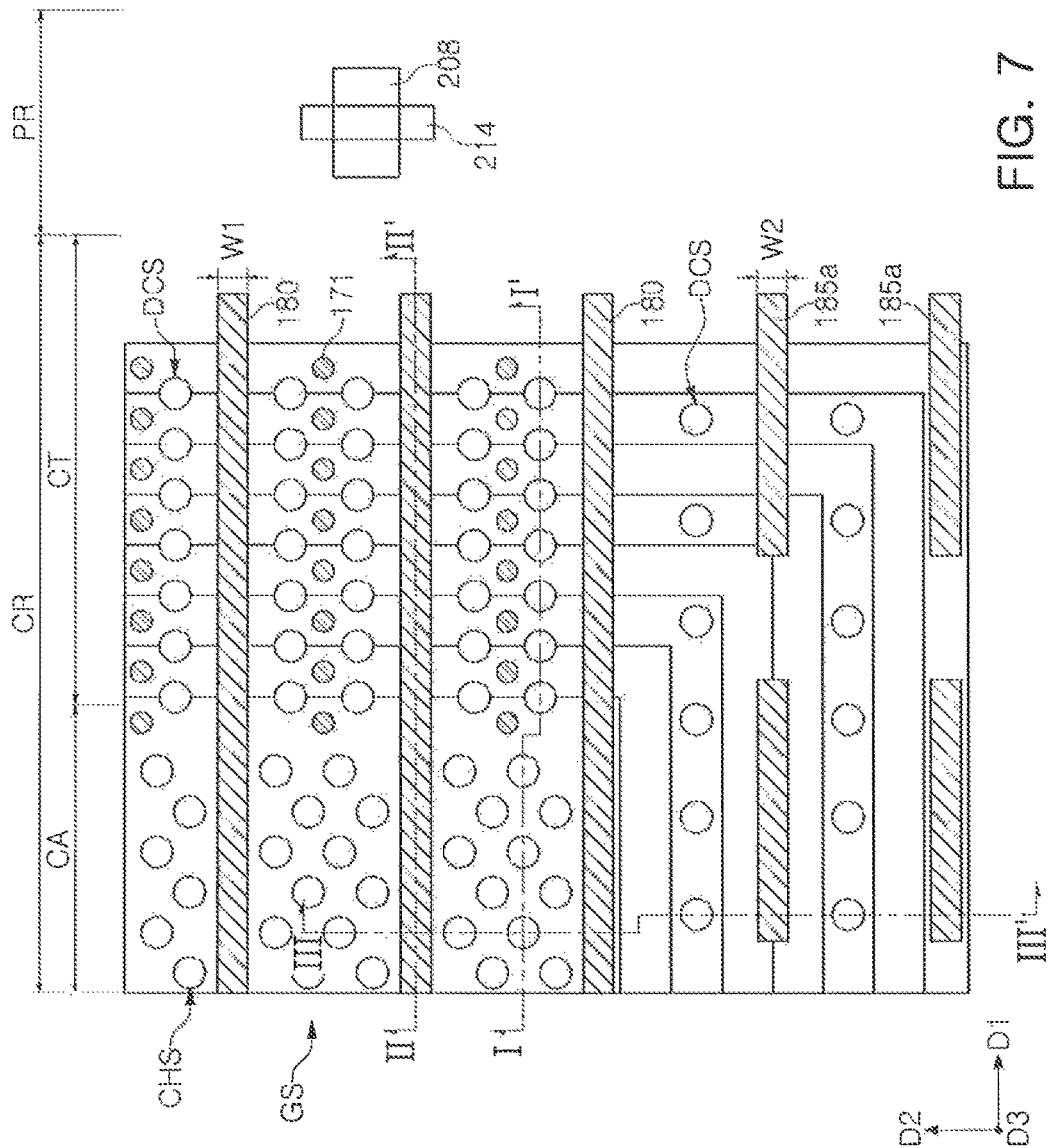
FIG. 7 is a schematic plan view of a vertical memory device according to an example embodiment of the present inventive concept.

FIG. 6 is a schematic layout diagram of a vertical memory device according to an example embodiment of the inventive concept, and FIG. 7 is a schematic plan view of a vertical memory device according to an example embodiment of the inventive concept.

In the case of the vertical memory device illustrated in FIGS. 6 and 7, a shape of dummy source lines 185*a* may be different from that of the vertical memory device illustrated in FIGS. 1 to 5. The remaining configurations or structures thereof in FIGS. 6 and 7 are the same as those of the vertical memory device illustrated in FIGS. 1 to FIG. 5, and thus, a description thereof will be omitted.

Referring to FIGS. 6 and 7, the vertical memory device may include a plurality of dummy source lines 185*a* extending in the same direction as a direction in which a plurality of common source lines 180 extend, for example, in a first direction D1. It can be seen that the dummy source lines 185*a* in this example have a length shorter than that of the plurality of common source lines 180. The plurality of dummy source lines 185*a* may be disposed in a plurality of linear shapes in a connection region CT.

Figure 8:
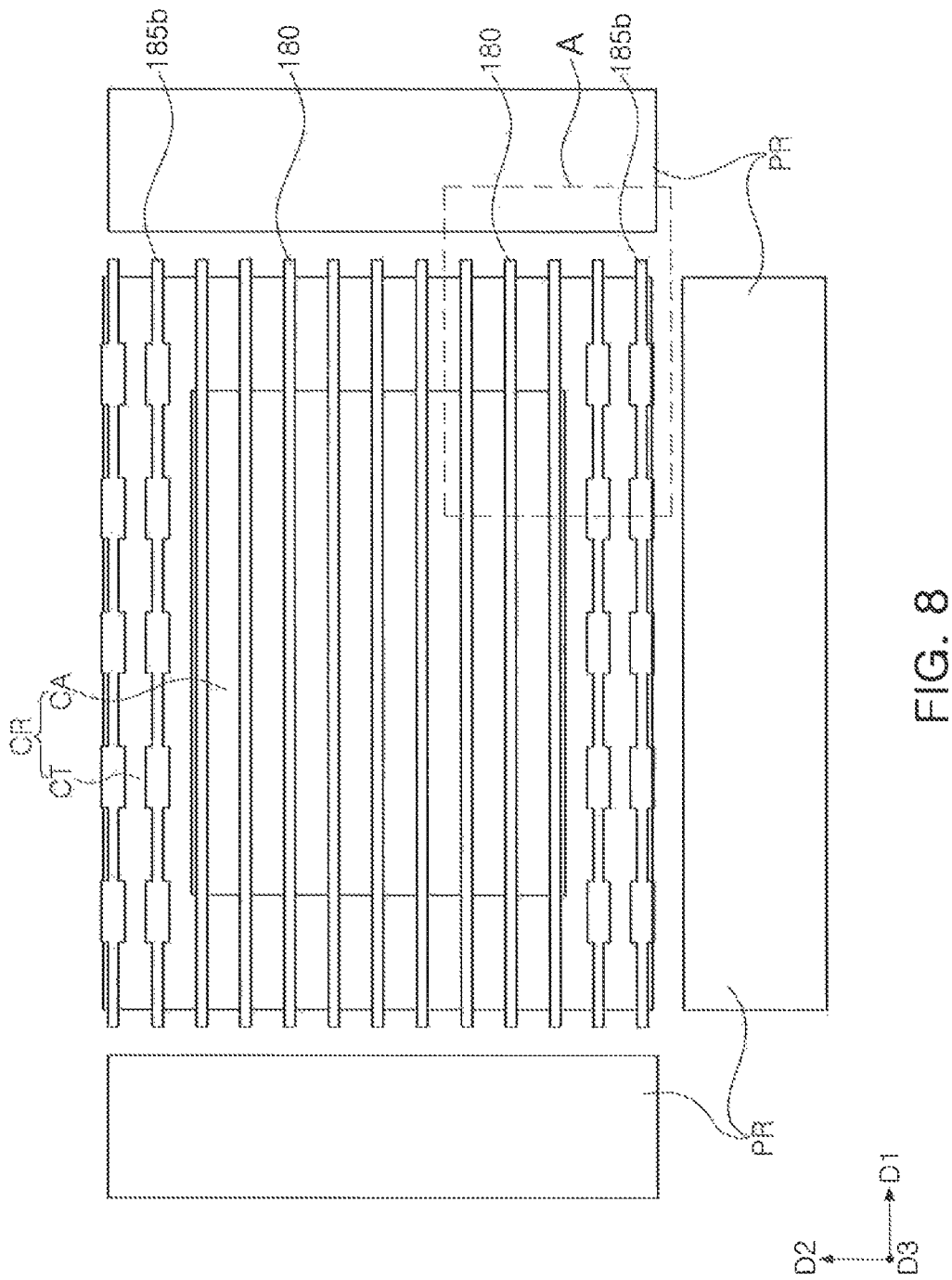
FIG. 8 is a schematic layout view of a vertical memory device according to an example embodiment of the present inventive concept.
Figure 9:
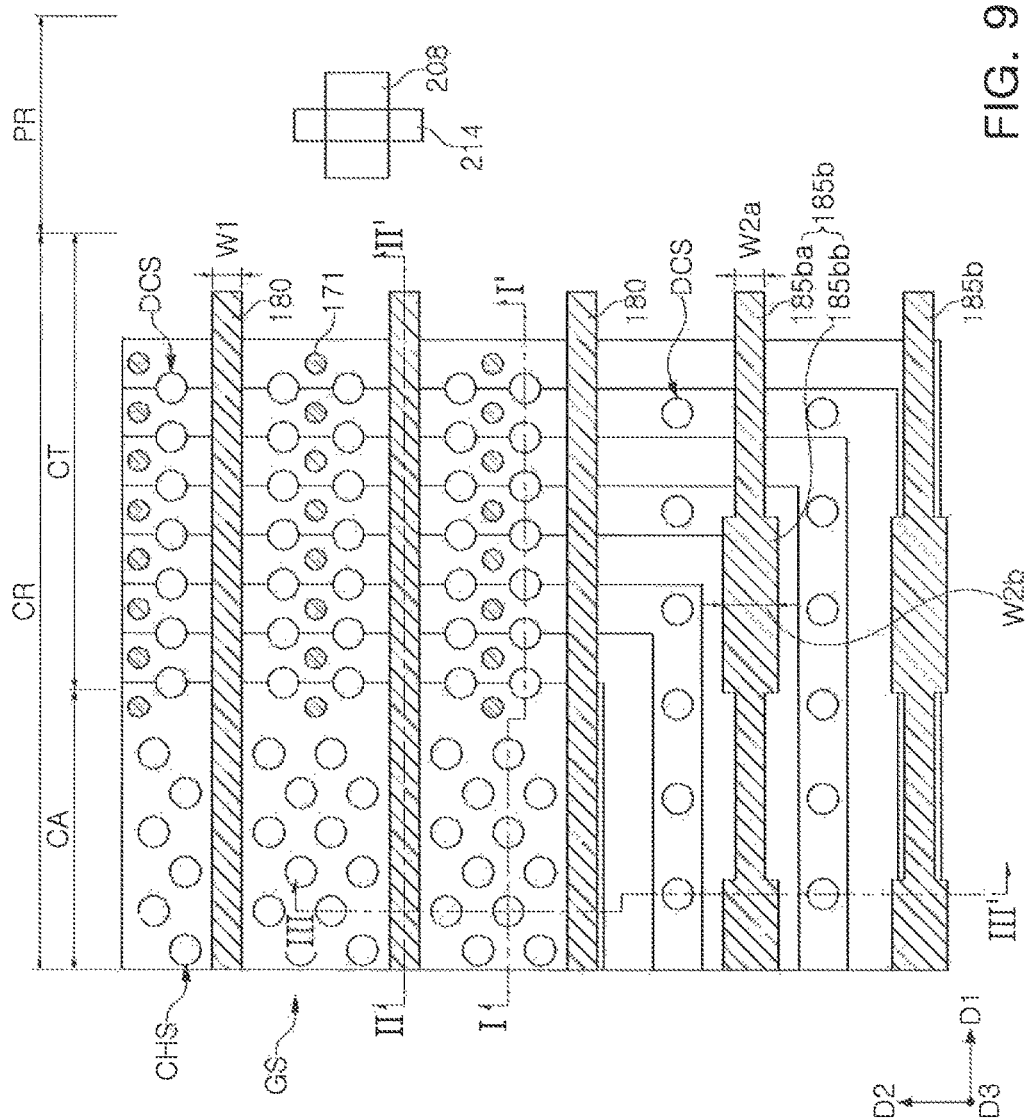
FIG. 9 is a schematic plan view of a vertical memory device according to an example embodiment of the present inventive concept.
Figure 10:
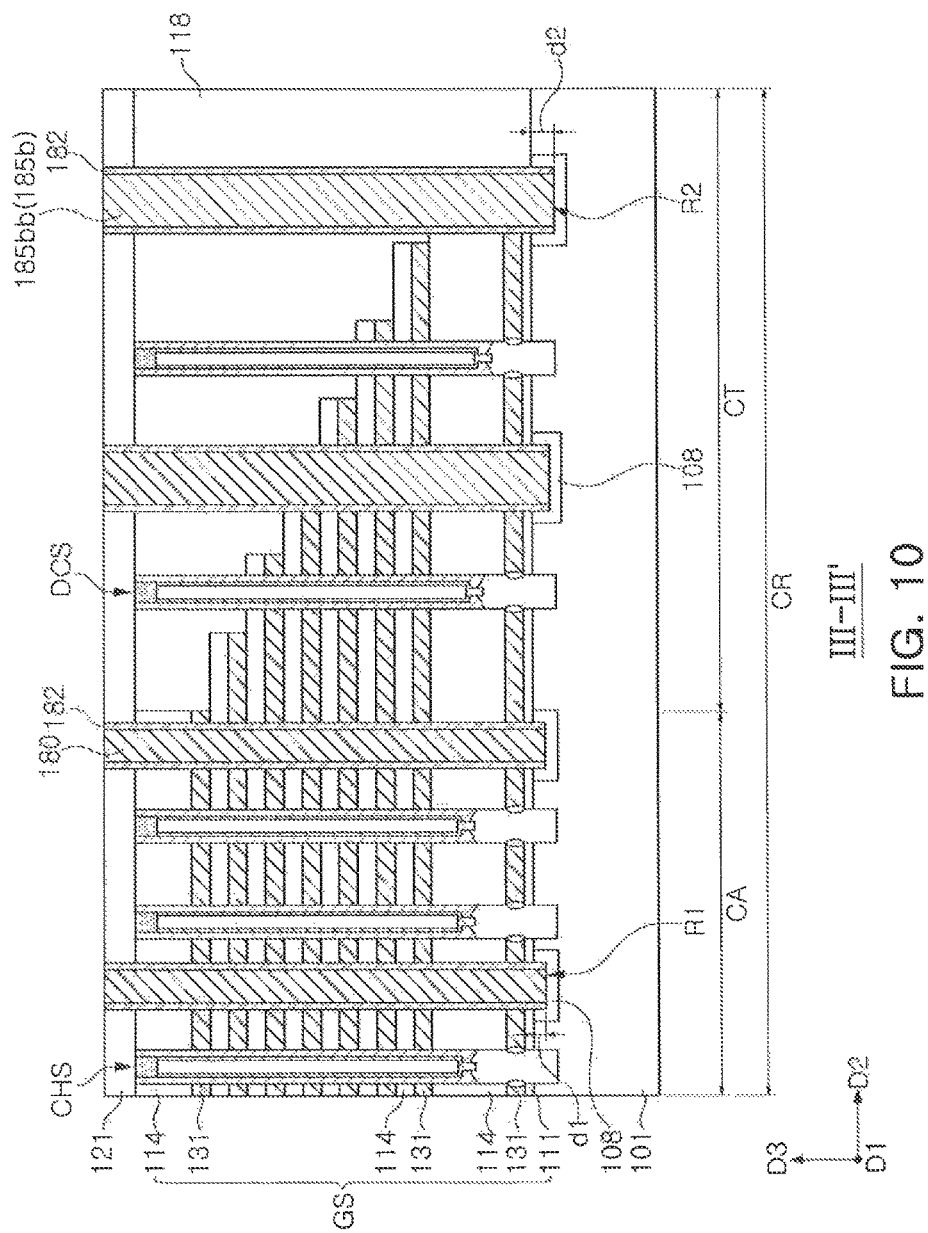
FIG. 10 is a schematic cross-sectional view of a vertical memory device according to an example embodiment of the present inventive concept.

FIG. 8 is a schematic layout view of a vertical memory device according to an example embodiment, FIG. 9 is a schematic plan view of a vertical memory device according to an example embodiment, and FIG. 10 is a schematic cross-sectional view of a vertical memory device according to an example embodiment, taken along line III-III' of FIG. 9.

In the case of the vertical memory device illustrated in FIGS. 8 to 10, there are a plurality of dummy source lines 185*b* which may have a different shape from that of the vertical memory device illustrated in FIGS. 1 to 5. The remaining configurations or structures in FIGS. 8 to 10 are the same as those of the vertical memory device illustrated in FIGS. 1 to FIG. 5, and thus, a description thereof will be omitted.

Referring now to FIGS. 8 to 10, the vertical memory device may include a plurality of dummy source lines 185*b* extending in the same direction as a direction in which the plurality of common source lines 180 extend, for example, in a first direction D1, and including regions having different line widths. For example, the plurality of dummy source lines 185*b* may be substantially parallel to the plurality of common source lines 180. The plurality of dummy source lines 185*b* may include first portions 185*ba* having a first line width W2*a* and second portions 185*bb* having a second line width W2*b* wider than the first line width W2*a*.

Figure 11:
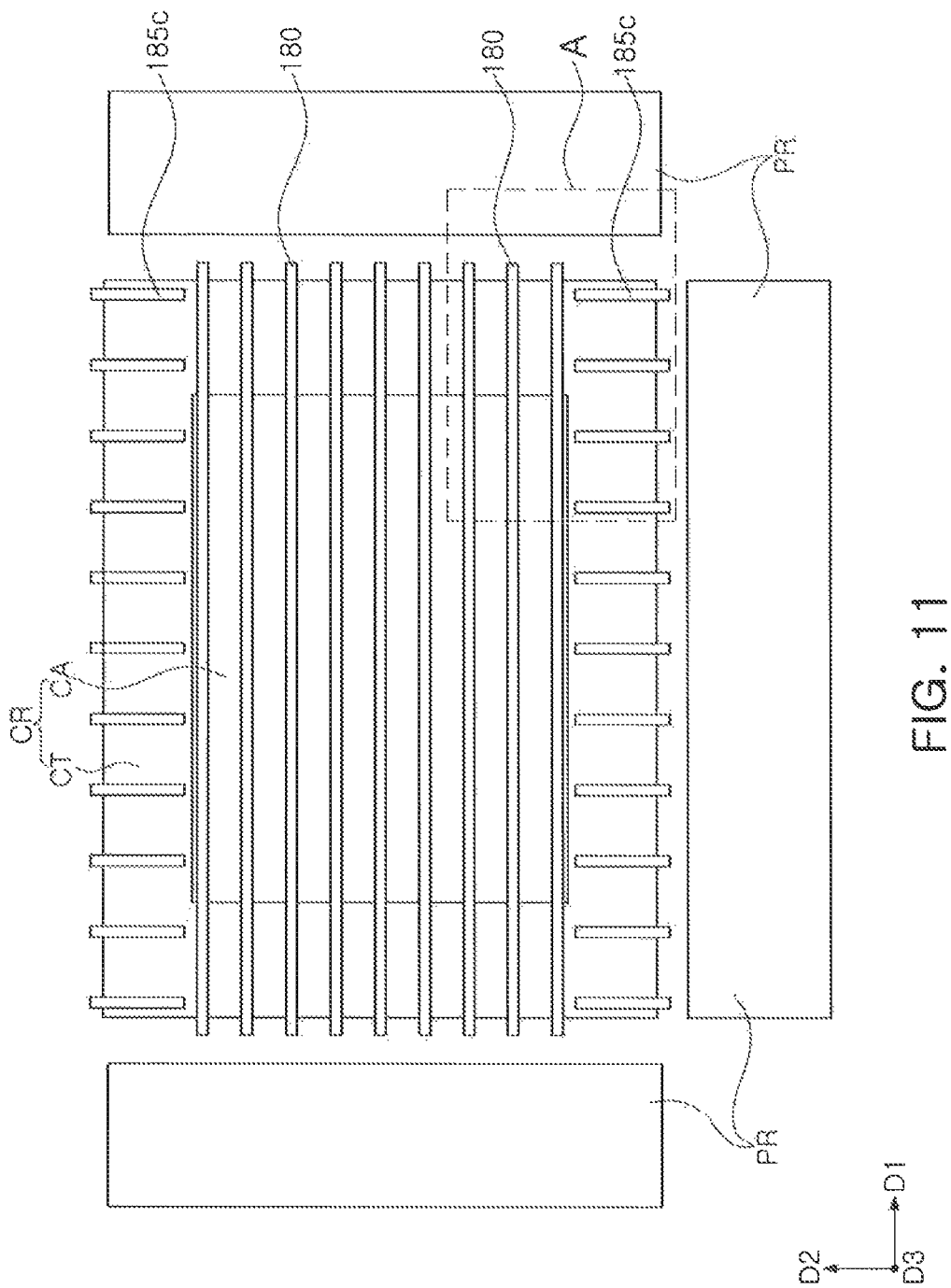
FIG. 11 is a schematic layout diagram of a vertical memory device according to an example embodiment of the present inventive concept.
Figure 12:
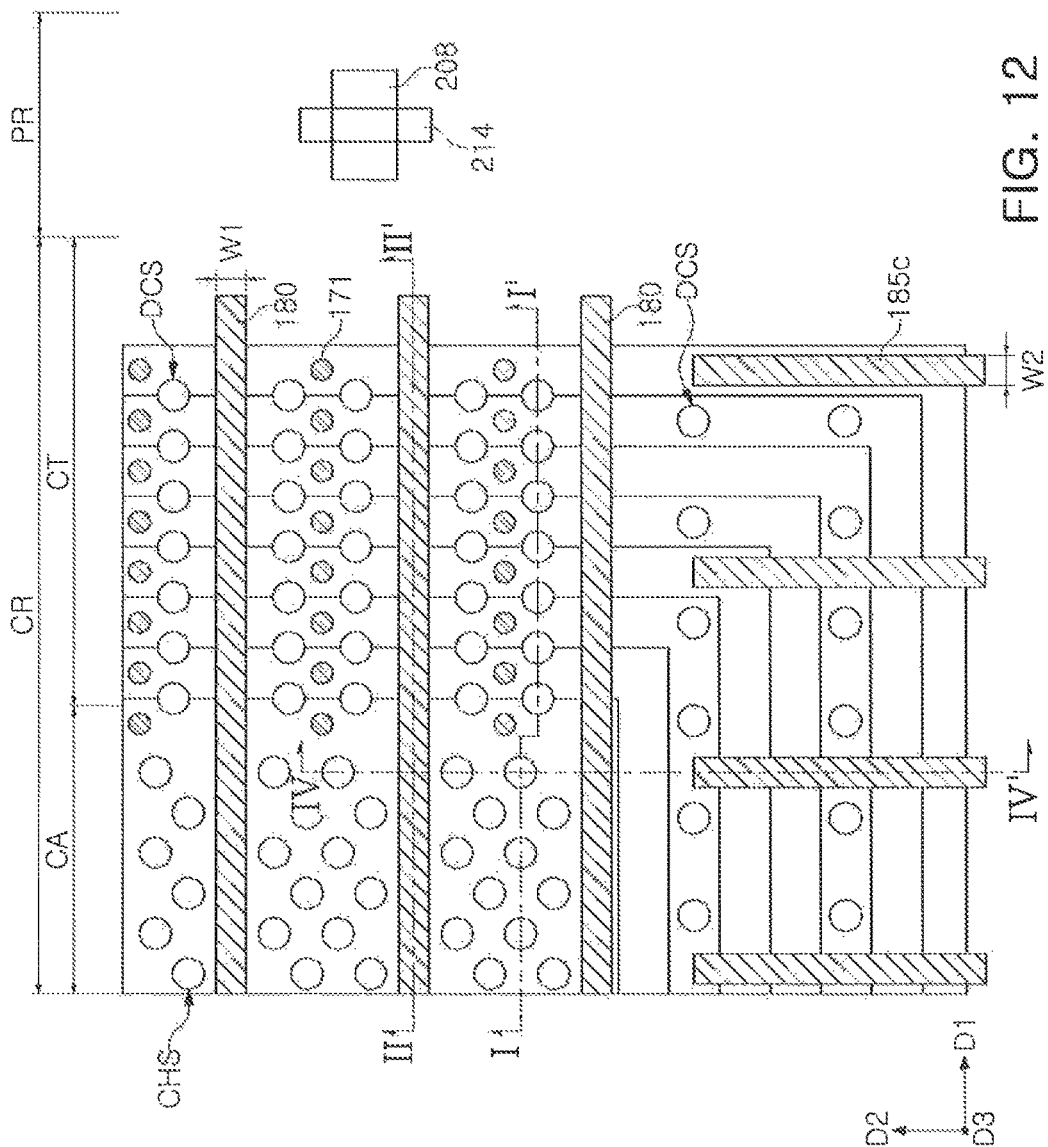
FIG. 12 is a schematic plan view of a vertical memory device according to an example embodiment of the present inventive concept.
Figure 13:
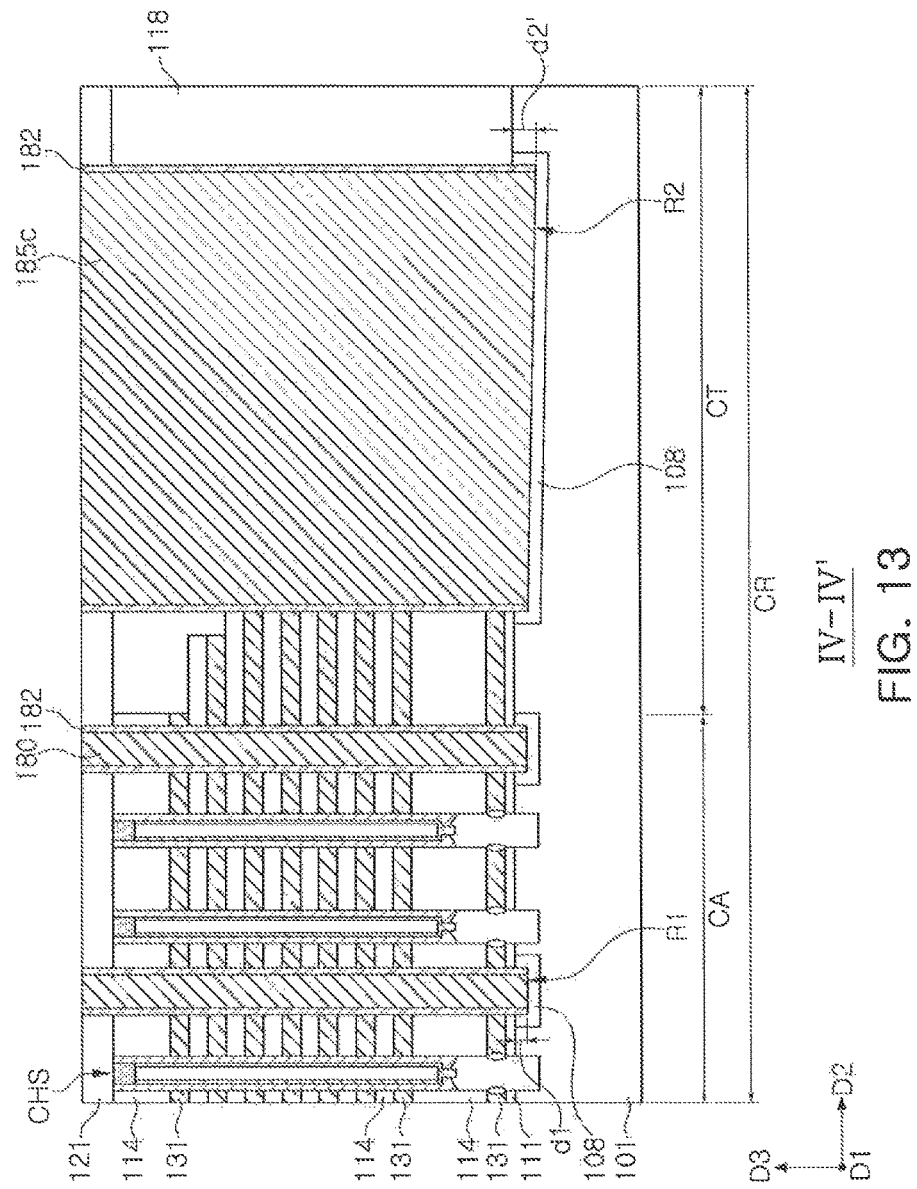
FIG. 13 is a schematic cross-sectional view of a vertical memory device according to an example embodiment of the present inventive concept.

FIG. 11 is a schematic layout diagram of a vertical memory device according to an example embodiment of the inventive concept, FIG. 12 is a schematic plan view of a vertical memory device according to an example embodiment of the inventive concept, and FIG. 13 is a schematic cross-sectional view of a vertical memory device according to an example embodiment of the inventive concept, taken along line IV-IV' of FIG. 12.

In the case of the vertical memory device illustrated in FIGS. 11 to 13, the shape and arrangement of the dummy source lines 185*c* maybe different from those of the vertical memory device illustrated in FIGS. 1 to 5. The remaining configurations or structures in FIGS. 11 to 13 are the same as those of the vertical memory device illustrated in FIGS. 1 to FIG. 5, and thus, a description thereof will be omitted.

Referring to FIGS. 11 to 13, the vertical memory device may include a plurality of dummy source lines 185c extending in a direction different from a direction in which a plurality of common source lines 180 extend, for example, in a second direction intersecting a first direction D1. For example, the dummy source lines 185c may be substantially perpendicular to the common source lines, whereas, for example, in FIGS. 1-5 or 8-10, the dummy source lines may be substantially parallel to the common source lines 180.

The plurality of dummy source lines 185c may extend to have a length shorter than that of the plurality of common source lines 180 in a connection region CT. The plurality of dummy source lines 185c may be disposed with an interval there between different from an interval between the plurality of common source lines 180. For example, the plurality of dummy source lines 185c may be arranged at an interval different from and greater than an interval between the plurality of common source lines 180.

Depths of the second recesses R2 (see FIG. 13) may be increased toward an edge of a connection region CT, based on an upper surface of a substrate 101. It can be seen in FIG. 13, for example, that a depth d2' of the second recess R2 at an edge portion of the connection region CT may be 15 nm or more greater than a depth d1 of a first recess R1 in a cell array region CA. A depth of each lower end portion of the plurality of dummy source lines 185c may be increased toward an edge of the connection region CT, based on the upper surface of the substrate 101. A depth of a lower end portion of the dummy source line 185c at an edge portion of the connection region CT may be 15 nm or more greater than a depth of a lower end portion of the common source line 180 in the cell array region CA.

Figure 14:
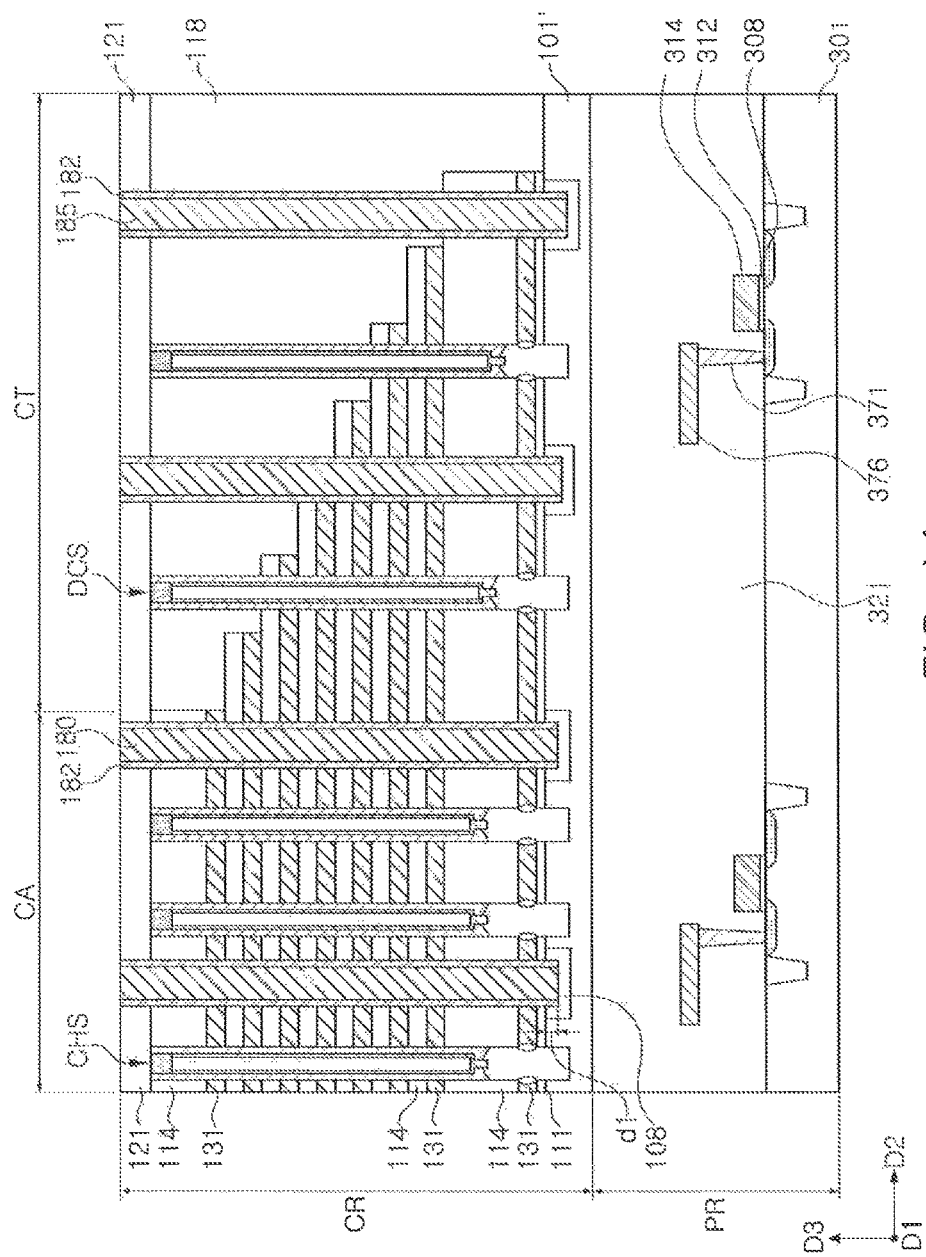
FIG. 14 is a schematic cross-sectional view of a vertical memory device according to an example embodiment of the present inventive concept.

FIG. 14 is a schematic cross-sectional view of a vertical memory device according to an example embodiment of the inventive concept. The vertical memory device illustrated in FIG. 14 may have a structure in which a peripheral circuit region PR is disposed below a cell region CR, in a manner different from the vertical memory device illustrated in FIGS. 1 to 5. The structure of the cell region CR may be the same as or similar to that of the vertical memory device illustrated in FIGS. 1 to 5.

Circuit transistors including a circuit gate insulating layer 312, a circuit gate electrode 314, and a source/drain region 308 may be disposed on a first substrate 301. A circuit wiring 376 and a contact plug 371 connected to the source/drain region 308 may be disposed. A second substrate 101' may be disposed on an interlayer insulating layer 321, and a cell region CR may be disposed on the second substrate 101'. The second substrate 101' may be formed of a semiconductor material such as, for example, polycrystalline silicon, monocrystalline silicon, or the like.

As set forth above, according to an example embodiment of the inventive concept, a vertical memory device having a structure as disclosed herein above, has a reduced possibility of a process defect, for example, a case in which a common source line and a dummy source line are not in contact with a substrate.

While example embodiments of the inventive concept have been shown and described above, those skilled in the art will understand that modifications and variations of the example embodiments disclosed herein can be made without departing from the scope of the present inventive concept as defined by the appended claims.

What is claimed is:

1. A vertical memory device comprising:
a substrate having a cell array region and a connection region adjacent to the cell array region;
a plurality of gate electrode layers stacked on the cell array region and the connection region of the substrate, and the plurality of gate electrode layers form a stepped structure in the connection region;
at least one first metal line dividing the plurality of gate electrode layers and connected to the cell array region and the connection region of the substrate; and
at least one second metal line dividing a portion of the plurality of gate electrode layers and connected to the connection region of the substrate,
wherein a depth of a lower end portion of the at least one second metal line is greater than a depth of a lower end portion of the at least one first metal line in the cell array region, based on an upper surface of the substrate.

2. The vertical memory device of claim 1, wherein the at least one second metal line extends in the same direction as a direction in which the at least one first metal line extends, and is disposed at an edge portion of the connection region.

3. The vertical memory device of claim 2, wherein a difference between a depth of a lower end portion of the at least one second metal line, and a depth of a lower end portion of the at least one first metal line in the cell array region is about 15 nm or more.

4. The vertical memory device of claim 1, wherein a height from the upper surface of the substrate to an upper surface of an uppermost gate electrode layer among the plurality of gate electrode layers is about 4.4 μm or more.

5. The vertical memory device of claim 1, wherein the at least one second metal line extends in a direction intersecting the at least one first metal line, and has a length shorter than a length of the at least one first metal line.

6. The vertical memory device of claim 5, wherein the at least one second metal line comprises a plurality of second metal lines, and a depth of the lower end portion of each of the second metal lines is increased relative to a respective position toward an edge of the connection region.

7. The vertical memory device of claim 1, wherein the at least one first metal line comprises a plurality of first metal lines, and the depth of the lower end portion of each of the first metal lines is increased relative to a respective position toward an edge of the connection region.

8. The vertical memory device of claim 7, wherein a difference between a depth of the lower end portion of the first metal lines in the cell array region and a depth of the lower end portion of the first metal lines at an edge portion of the connection region is about 15 nm or more.

9. The vertical memory device of claim 1, wherein the at least one second metal line comprises a plurality of second metal lines extending in the same direction as a direction in which the first metal line extends, and having a length shorter than a length of the first metal line.

10. The vertical memory device of claim 1, wherein the at least one second metal line comprises a plurality of second metal lines, and the at least one first metal line comprises a plurality of first metal lines, and wherein the second metal lines comprise portions having different line widths.

11. The vertical memory device of claim 1, further comprising channel structures disposed in the cell array region, extending in a direction perpendicular to the upper surface of the substrate, and penetrating through the plurality of gate electrode layers.

12. The vertical memory device of claim 11, further comprising dummy channel structures disposed in the connection region, extending in the same direction as a direction in which the channel structures extend, and the dummy channel structures penetrating through at least a portion of the plurality of gate electrode layers.

13. The vertical memory device of claim 12, wherein the channel structures and the dummy channel structures have the same or a similar structure.

14. A vertical memory device comprising:
a substrate having a cell array region and a connection region located adjacent the cell array region;
first and second recesses formed in an upper portion of the substrate, the first recess extending in a first direction in the cell array region and the connection region and the second recess being disposed in the connection region;
a common source line disposed on the first recess; and
a dummy source line disposed on the second recess,
wherein a depth of the second recess is greater than a depth of the first recess of the cell array region, based on an upper surface of the substrate.

15. The vertical memory device of claim 14, wherein the dummy source line and the second recess extend in the first direction, and the second recess is located at an edge portion of the connection region; and
the depth of the second recess is about 15 nm or more greater than the depth of the first recess of the cell array region.

16. The vertical memory device of claim 14, wherein the dummy source line and the second recess extend in a second direction intersecting the first direction, and the depth of the second recess is increased toward an edge of the connection region.

17. The vertical memory device of claim 16, wherein the depth of the second recess at an edge portion of the connection region is about 15 nm or more greater than the depth of the first recess in the cell array region.

18. The vertical memory device of claim 14, wherein the depth of the first recess is increased toward an edge of the connection region in the connection region.

19. The vertical memory device of claim 18, wherein the depth of the first recess at an edge portion of the connection region is about 15 nm or more greater than the depth of the first recess in the cell array region.

20. A vertical memory device comprising:
a substrate having a cell array region and a connection region adjacent to the cell array region;
a stacked structure including a plurality of gate electrode layers stacked on the cell array region and the connection region of the substrate, and extending to have different lengths in the connection region;
a common source line dividing the stacked structure in the cell array region and the connection region; and
a dummy source line dividing the stacked structure in the connection region,
wherein a vertical length of the dummy source line is greater than a vertical length of the common source line.

* * * * *